US008569613B1

(12) United States Patent
Brown

(10) Patent No.: US 8,569,613 B1
(45) Date of Patent: Oct. 29, 2013

(54) MULTI-TERMINAL PHOTOVOLTAIC MODULE INCLUDING INDEPENDENT CELLS AND RELATED SYSTEM

(75) Inventor: Albert S. Brown, San Francisco, CA (US)

(73) Assignee: Stion Corporation, San Jose, CA (US)

( * ) Notice: Subject to any disclaimer, the term of this patent is extended or adjusted under 35 U.S.C. 154(b) by 468 days.

(21) Appl. No.: 12/568,660

(22) Filed: Sep. 28, 2009

Related U.S. Application Data

(60) Provisional application No. 61/101,139, filed on Sep. 29, 2008.

(51) Int. Cl.
*H01L 31/042* (2006.01)
(52) U.S. Cl.
USPC ........... 136/256; 136/252; 136/293; 136/244; 438/74; 438/93
(58) Field of Classification Search
USPC ............... 136/256, 252, 293, 244; 438/74, 93
See application file for complete search history.

(56) References Cited

U.S. PATENT DOCUMENTS

| | | | |
|---|---|---|---|
| 4,239,553 A | 12/1980 | Barnett et al. | |
| 4,446,916 A | 5/1984 | Hayes | |
| 4,488,948 A | 12/1984 | Larson et al. | |
| 4,658,086 A | 4/1987 | McLeod et al. | |
| 4,710,589 A * | 12/1987 | Meyers et al. | 136/258 |
| 4,782,377 A | 11/1988 | Mahan | |

(Continued)

FOREIGN PATENT DOCUMENTS

| | | |
|---|---|---|
| GB | 2 332 684 A | 6/1999 |
| WO | WO 2010/025291 A2 | 3/2010 |
| WO | WO 2010/039727 A1 | 4/2010 |
| WO | WO 2010/107705 A1 | 9/2010 |

OTHER PUBLICATIONS

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

(Continued)

*Primary Examiner* — Golam Mowla
(74) *Attorney, Agent, or Firm* — Kilpatrick Townsend & Stockton LLP

(57) ABSTRACT

A multi-terminal photovoltaic module includes an upper photovoltaic device which has a first upper electrode, an overlying upper absorber layer, an overlying upper window layer, and a second upper electrode. The upper absorber layer has an upper band gap in a first band gap range. The module also includes a lower photovoltaic device which has a first lower electrode, an overlying lower absorber layer, an overlying lower window layer, and a second lower electrode. The lower absorber layer has a lower band gap in a second band gap range. The module also includes a bonding material coupling the second upper electrode and the first lower electrode. Moreover, the module includes a first upper terminal coupling the first upper electrode and a second upper terminal coupling the second upper electrode. The module further includes a first lower terminal coupling the first lower electrode and a second lower terminal coupling the second lower electrode. In an embodiment, the module provides a first open circuit voltage provided between the first upper electrode and the second upper electrode and a second open circuit voltage provided between the first lower electrode and the second lower electrode. In an embodiment, the first open circuit voltage is different from the second open circuit voltage.

15 Claims, 10 Drawing Sheets

(56) References Cited

U.S. PATENT DOCUMENTS

| | | | |
|---|---|---|---|
| 4,996,108 A | 2/1991 | Divigalpitiya et al. | |
| 5,125,984 A | 6/1992 | Kruehler et al. | |
| 5,261,968 A | 11/1993 | Jordan | |
| 5,261,969 A | 11/1993 | Stanbery | |
| 5,397,401 A | 3/1995 | Toma et al. | |
| 5,501,744 A | 3/1996 | Albright et al. | |
| 5,536,333 A | 7/1996 | Foote et al. | |
| 5,578,503 A | 11/1996 | Karg et al. | |
| 5,665,175 A | 9/1997 | Safir | |
| 5,733,382 A | 3/1998 | Hanoka | |
| 6,040,521 A | 3/2000 | Kushiya et al. | |
| 6,066,797 A * | 5/2000 | Toyomura et al. | 136/251 |
| 6,257,175 B1 | 7/2001 | Mosher et al. | |
| 6,288,325 B1 | 9/2001 | Jansen et al. | |
| 6,310,281 B1 | 10/2001 | Wendt et al. | |
| 6,320,115 B1 | 11/2001 | Kataoka et al. | |
| 6,328,871 B1 | 12/2001 | Ding et al. | |
| 6,350,946 B1 | 2/2002 | Miyake et al. | |
| 6,548,751 B2 | 4/2003 | Sverdrup et al. | |
| 7,141,863 B1 | 11/2006 | Compaan et al. | |
| 7,855,089 B2 | 12/2010 | Farris, III et al. | |
| 7,863,074 B2 | 1/2011 | Wieting | |
| 7,910,399 B1 | 3/2011 | Wieting | |
| 2001/0050234 A1 | 12/2001 | Shiepe | |
| 2002/0026955 A1* | 3/2002 | Ouchida et al. | 136/251 |
| 2002/0038663 A1 | 4/2002 | Zenko et al. | |
| 2003/0227017 A1 | 12/2003 | Yasuno | |
| 2005/0006228 A1 | 1/2005 | Hyun | |
| 2005/0056312 A1 | 3/2005 | Young et al. | |
| 2005/0109392 A1* | 5/2005 | Hollars | 136/265 |
| 2005/0150542 A1 | 7/2005 | Madan | |
| 2005/0183962 A1 | 8/2005 | Oakes | |
| 2006/0037641 A1 | 2/2006 | Kibbel et al. | |
| 2006/0130890 A1 | 6/2006 | Hantschel et al. | |
| 2006/0180464 A1 | 8/2006 | Griffin | |
| 2006/0220059 A1 | 10/2006 | Satoh et al. | |
| 2007/0089782 A1 | 4/2007 | Scheuten et al. | |
| 2007/0151596 A1 | 7/2007 | Nasuno et al. | |
| 2007/0160770 A1 | 7/2007 | Stanbery | |
| 2007/0169810 A1 | 7/2007 | Van Duren et al. | |
| 2008/0041446 A1 | 2/2008 | Wu et al. | |
| 2008/0092945 A1 | 4/2008 | Munteanu et al. | |
| 2008/0092953 A1 | 4/2008 | Lee | |
| 2008/0173390 A1 | 7/2008 | Narasimhan et al. | |
| 2008/0216885 A1* | 9/2008 | Frolov et al. | 136/244 |
| 2008/0257751 A1 | 10/2008 | Smola et al. | |
| 2009/0020149 A1 | 1/2009 | Woods et al. | |
| 2009/0301562 A1 | 12/2009 | Lee | |
| 2009/0308437 A1 | 12/2009 | Woods et al. | |
| 2010/0051090 A1 | 3/2010 | Lee | |
| 2010/0078059 A1 | 4/2010 | Lee | |
| 2010/0099214 A1 | 4/2010 | Buquing | |
| 2010/0229921 A1 | 9/2010 | Farris, III et al. | |
| 2011/0017257 A1 | 1/2011 | Lee | |
| 2011/0017298 A1 | 1/2011 | Lee | |

OTHER PUBLICATIONS

International Search Report & Written Opinion of PCT Application No. PCT/US 09/46161, date of mailing Jul. 27, 2009, 14 pages total.

International Search Report & Written Opinion of PCT Application No. PCT/US 09/46802, mailed on Jul. 31, 2009, 11 pages total.

Onuma et al., Preparation and Characterization of CuInS Thin Films Solar Cells with Large Grain, Elsevier Science B.V; Solar Energy Materials & Solar Cells 69 (2001) pp. 261-269.

Gee, J.M., et al., "A 31%-Efficient GaAs/ Silicon Mechanically Stacked, Multijunction Concentrator Solar Cell", 20th IEEE Photovoltaic Specialist Conference, IEEE Publishing, New York, NY, 1988, pp. 754-758.

Meyers, P.V., et al., "Polycrystalline CdTe on CuInSe2 Cascaded Solar Cells", Conference Record of the Twentieth IEEE Photovoltaic Specialists Conference, Las Vegas, NV, Sep. 26-30, 1988, pp. 1448-1451, vol. 2.

Schorr, S. et al., "Electronic Band Gap of $Zn_{2x}(CuIn)_{1-x}X_2$ Solid Solution Series (X=S, Se, Te)", Journal of Alloys and Compounds, Apr. 13, 2006, pp. 26-30, vol. 414, No. 1-2.

Wu, X., et al. "13.9%-efficient CdTe Polycrystalline Thin-film Solar Cells with an Infrared Transmission of ~ 50%", Progress in Photovoltaics: Research and Applications, Dec. 30, 2005, pp. 471-483, vol. 14, No. 6.

Young, D.L., et al. "Interconnect Junctions for Thin-Film Tandem Solar Cells", Proceedings of the 3rd World Conference on Photovoltaic Energy Conversion, Osaka, Japan, May 11-18, 2003, pp. 27-30, vol. 1.

International Search Report and Written Opinion for PCT Application No. PCT/US2009/055243, mailed on Mar. 11, 2011, 11 pages.

Final Office Action of May 12, 2011 for U.S. Appl. No. 12/512,979, 14 pages.

Final Office Action of Apr. 12, 2011 for U.S. Appl. No. 12/562,086, 26 pages.

Non-Final Office Action of Mar. 1, 2011 for U.S. Appl. No. 12/558,108, 21 pages.

Martil et al., "Growth and physical properties of CuGaSe2 thin films by r.f. sputtering", Journal of Materials Science Letter, vol. 19, 1990, pp. 237-240.

Rostan, et al. "Formation of Transparent and Ohmic ZnO:A1/MoSe2 Contacts for Bifacial Cu (in,Ga)Se2 Solar Cells and Tandem Structures", Thin Solid Films, vol. 480-481, pp. 67-70, 2005.

Symko-Davies, "NREL High-Performance Photovoltaic Project Kickoff Meeting", Oct. 18, 2001, 121 pages.

International Search Report and Written Opinion for PCT Application No. PCT/US2010/27342, mailed on May 17, 2010, 13 pages.

International Search Report & Written Opinion of PCT Application No. PCT/US2009/58829, mailed on Nov. 25, 2009, 12 pages.

Non-Final Office Action of Dec. 23, 2010 for U.S. Appl. No. 12/512,978, 13 pages.

Final Office Action of Dec. 23, 2010 for U.S. Appl. No. 12/475,858, 28 pages.

Non-Final Office Action of Dec. 22, 2010 for U.S. Appl. No. 12/271,704 14 pages.

Non-Final Office Action of Sep. 2, 2010 for U.S. Appl. No. 12/562,086; 14 pages.

Non-Final Office Action of Aug. 30, 2010 for U.S. Appl. No. 12/512,979, 13 pages.

Non-Final Office Action of Aug. 17, 2010 for U.S. Appl. No. 12/475,858, 17 pages.

* cited by examiner

MULTI-TERMINAL PHOTOVOLTAIC MODULE INCLUDING INDEPENDENT CELLS AND RELATED SYSTEM

CROSS-REFERENCES TO RELATED APPLICATIONS

This application claims priority to U.S. Provisional Patent Application No. 61/101,139, filed Sep. 29, 2008, entitled "A MULTI-TERMINAL PHOTOVOLTAIC MODULE INCLUDING INDEPENDENT CELLS AND RELATED SYSTEM," commonly owned and incorporated by reference in its entirety herein for all purposes.

BACKGROUND OF THE INVENTION

The present invention relates generally to photovoltaic materials. More particularly, the present invention provides a method and structure for manufacture of a multi-terminal solar module using independent device structures and methods for thin and thick film photovoltaic materials. Merely by way of example, the present method and structure have been implemented using a solar module having multiple thin film materials, but it would be recognized that the invention may have other configurations.

From the beginning of time, human beings have been challenged to find way of harnessing energy. Energy comes in the forms such as petrochemical, hydroelectric, nuclear, wind, biomass, solar, and more primitive forms such as wood and coal. Over the past century, modern civilization has relied upon petrochemical energy as an important source. Petrochemical energy includes gas and oil. Gas includes lighter forms such as butane and propane, commonly used to heat homes and serve as fuel for cooking. Gas also includes gasoline, diesel, and jet fuel, commonly used for transportation purposes. Heavier forms of petrochemicals can also be used to heat homes in some places. Unfortunately, petrochemical energy is limited and essentially fixed based upon the amount available on the planet Earth. Additionally, as more human beings begin to drive and use petrochemicals, it is becoming a rather scarce resource, which will eventually run out over time.

More recently, clean sources of energy have been desired. An example of a clean source of energy is hydroelectric power. Hydroelectric power is derived from electric generators driven by the force of water that has been held back by large dams such as the Hoover Dam in Nevada. The electric power generated is used to power up a large portion of Los Angeles, Calif. Other types of clean energy include solar energy. Specific details of solar energy can be found throughout the present background and more particularly below.

Solar energy generally converts electromagnetic radiation from our sun to other useful forms of energy. These other forms of energy include thermal energy and electrical power. For electrical power applications, solar cells are often used. Although solar energy is clean and has been successful to a point, there are still many limitations before it becomes widely used throughout the world. As an example, one type of solar cell uses crystalline materials, which form from semiconductor material ingots. These crystalline materials include photo-diode devices that convert electromagnetic radiation into electrical current. Crystalline materials are often costly and difficult to make on a wide scale. Additionally, devices made from such crystalline materials have low energy conversion efficiencies. Other types of solar cells use "thin film" technology to form a thin film of photosensitive material to be used to convert electromagnetic radiation into electrical current. Similar limitations exist with the use of thin film technology in making solar cells. That is, efficiencies are often poor. Additionally, film reliability is often poor and cannot be used for extensive periods of time in conventional environmental applications. There have been attempts to form heterojunction cells using a stacked configuration. Although somewhat successful, it is often difficult to match currents between upper and lower solar cells. These and other limitations of these conventional technologies can be found throughout the present specification and more particularly below.

From the above, it is seen that improved techniques for manufacturing photovoltaic materials and resulting devices are desired.

BRIEF SUMMARY OF THE INVENTION

According to the present invention, techniques related to photovoltaic materials are provided. More particularly, the present invention provides a method and structure for manufacture of a multi-terminal solar module using independent device structures and methods for thin and thick film photovoltaic materials. Merely by way of example, the present method and structure have been implemented using a solar module having multiple thin film materials, but it would be recognized that the invention may have other configurations.

According to an embodiment, the invention provides a multi-terminal photovoltaic module. The photovoltaic module includes an upper photovoltaic device which has a first upper electrode, an overlying upper absorber layer, an overlying upper window layer, and a second upper electrode. The upper absorber layer has an upper band gap in a first band gap range. The module also includes a lower photovoltaic device which has a first lower electrode, an overlying lower absorber layer, an overlying lower window layer, and a second lower electrode. The lower absorber layer has a lower band gap in a second band gap range. The module also includes a bonding material coupling the second upper electrode and the first lower electrode. Moreover, the module includes a first upper terminal coupling the first upper electrode and a second upper terminal coupling the second upper electrode. The module further includes a first lower terminal coupling the first lower electrode and a second lower terminal coupling the second lower electrode. In an embodiment, the module provides a first open circuit voltage provided between the first upper electrode and the second upper electrode and a second open circuit voltage provided between the first lower electrode and the second lower electrode. In an embodiment, the first open circuit voltage is different from the second open circuit voltage.

In an embodiment, the module further includes a first inverter coupling the first upper terminal and the second upper terminal. In another embodiment, the module also includes a second inverter coupling the first lower terminal and the second lower terminal.

In some embodiments of the multi-terminal photovoltaic module, the first band gap range extends from about 1.4 eV to about 2.5 eV. In a specific embodiment, the first band gap range extends from about 1.6 eV to about 2.3 eV. In some embodiments, the second band gap range extends from about 0.7 eV to about 1.2 eV. In an embodiment, the second band gap range extends from about 0.4 eV to about 1.0 eV. In some embodiments, the first open circuit voltage ranges from about 0.7V to about 1.5V. In some embodiments, the first open circuit voltage ranges from about 0.6V to about 1.2V. In certain embodiments, the first open circuit voltage ranges from about 0.5V to about 1.1V. In some embodiments, the second open circuit voltage ranges from about 0.2V to about 0.8V. In other embodiments, the second open circuit voltage ranges from about 0.3V to about 0.7V. In alternative embodiments, the second open circuit voltage ranges from about 0.2V to about 0.6V.

In some embodiments of the module, the upper photovoltaic device and the lower photovoltaic device are isolated by an isolating material. The isolating material can also includes bonding material for bonding the upper and the lower photovoltaic devices together. In an embodiment, the bonding material comprises EVA. In another embodiments, the bonding material comprises a double sided tape material.

Depending upon the specific embodiment, one or more of these features may also be included. The present technique provides an easy to use process that relies upon conventional technology that is nanotechnology based. In some embodiments, the method may provide higher efficiencies in converting sunlight into electrical power using a multiple terminal design and method. Depending upon the embodiment, the efficiency can be about 10 percent or 20 percent or greater. Additionally, the method provides a process that is compatible with conventional process technology without substantial modifications to conventional equipment and processes. In a specific embodiment, the present method and structure can also be provided using large scale manufacturing techniques, which reduce costs associated with the manufacture of the photovoltaic devices. In another specific embodiment, the present method and structure can also be provided using any combination of suitable single junction solar cell designs to form top and lower cells, although there can be more than two stacked cells that are independent of each other depending upon the embodiment. Depending upon the embodiment, one or more of these benefits may be achieved. These and other benefits will be described in more throughout the present specification and more particularly below.

Various additional features and advantages of the present invention can be more fully appreciated with reference to the detailed description and accompanying drawings that follow.

DETAILED DESCRIPTION OF THE INVENTION

According to the present invention, techniques related to photovoltaic materials are provided. More particularly, the present invention provides a method and structure for manufacture of a multi-terminal solar module using independent device structures and methods for thin and thick film photovoltaic materials. Merely by way of example, the present method and structure have been implemented using a solar module having multiple thin film materials, but it would be recognized that the invention may have other configurations.

Figure 1:
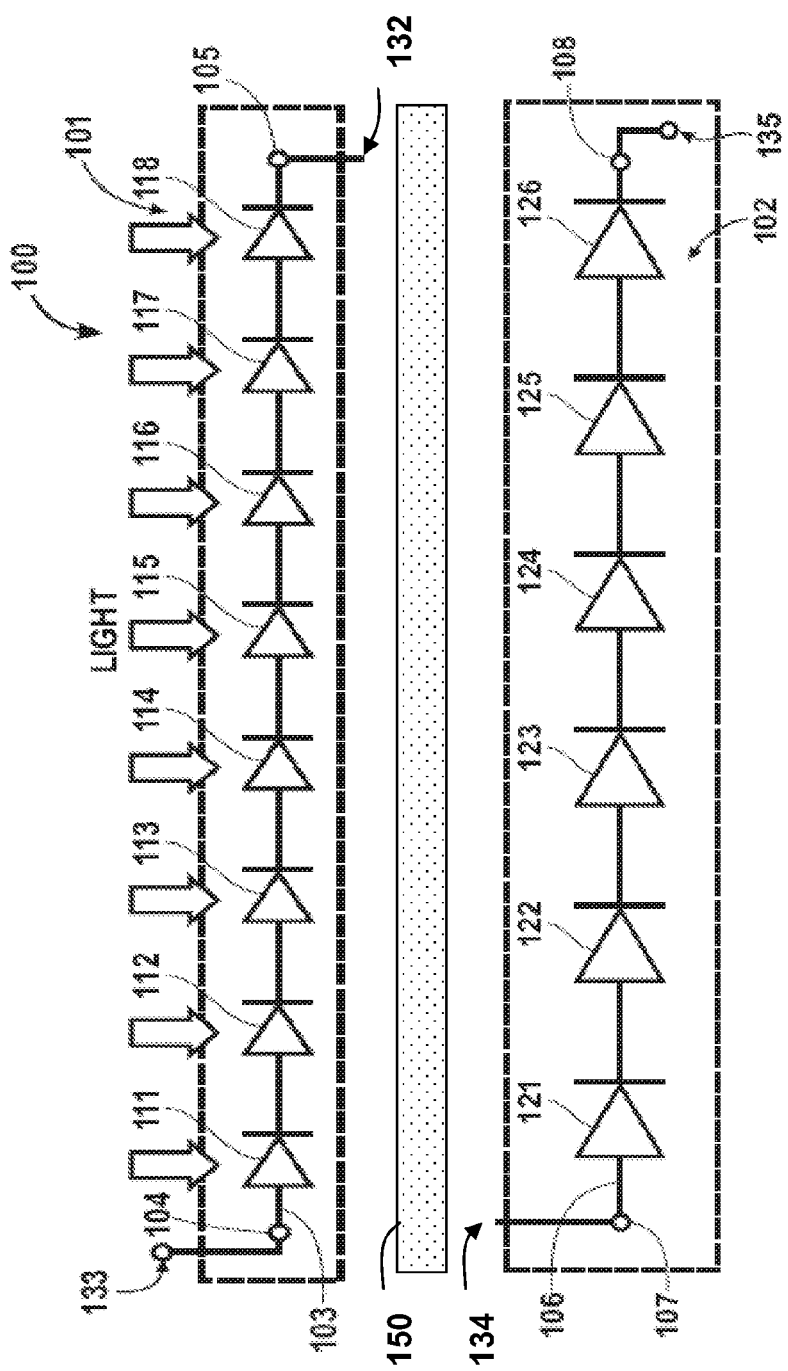
FIG. 1 is a simplified diagram of a structure for a module having multi-terminals cells according to a specific embodiment of the present invention.

FIG. 1 is a simplified diagram of a structure for a module 100 having a multi-terminal module according to a specific embodiment of the present invention. This diagram is merely an example, which should not unduly limit the scope of the claims herein. One of ordinary skill in the art would recognize other variations, modifications, and alternatives. As shown, photovoltaic module 100 is formed on a substrate (not shown) and includes sub-module 101 and sub-module 102, which are independent and separate from each other electrically but mechanically coupled to each other. In the embodiment shown in FIG. 1, sub-module 101 includes photovoltaic devices labeled as cells 111-118, with each cell shown schematically as a diode. Sub-module 101 also has a first connector 103 interconnecting photovoltaic devices labeled as cells 111-118 in a serial configuration. The first connector has a first terminal end 104 and a second terminal end 105. As shown in FIG. 1, sub-module 102 includes photovoltaic devices labeled as cells 121-126, with each cell shown schematically as a diode. Sub-module 102 also has a second connector 106 interconnecting solar cells 121-126 in a serial configuration. The second connector has a first terminal end 107 and a second terminal end 108, which are separate and electrically isolated from sub-module 101. As shown, sub-modules 101 and 102 are not serially connected to each other.

In some embodiments, an insulating material 150 is disposed between sub-modules 101 and 102, such that sub-modules 101 and 102 are electrically insulated from each other. In some embodiments, the insulating material can include dielectrics, plastic materials, etc. In certain embodiments, the insulating material can include a bonding material that bonds sub-modules 101 and 102 together mechanically. In an embodiment, the bonding material can include double sided tape material. In another embodiment, the bonding material can include polymer, such as EVA. Of course, there can be other variations, modifications, and alternatives.

In a specific embodiment, cells 111-118 in sub-module 101 are made of a semiconductor material having a first band gap and are constructed so that each cell provides substantially the same current, designated as $I_1$. As shown, cells 111-118 are serially connected between terminal ends 104 and 105 of sub-module 101. A terminal voltage $V_1$ is provided between terminal ends 104 and 105. The terminal voltage $V_1$ is substantially a sum of the voltages provided in each of cells 111-118.

Similarly, cells 121-126 in sub-module 102 are made of a second semiconductor material having a second band gap and are constructed so that each cell provides substantially the same current, designated as $I_2$. As shown, cells 121-126 are serially connected between terminal ends 107 and 108 of sub-module 102. A terminal voltage $V_2$ is provided between terminal ends 107 and 108. The terminal voltage $V_2$ is substantially a sum of the voltages provided in each of cells 121-126.

According to an embodiment of the invention, sub-module 101 and sub-module 102 are not electrically connected in series/parallel to form module 100, as shown in FIG. 1. In this embodiment, current $I_1$ in sub-module 101 and current $I_2$ in sub-module 102 are substantially not matched. As a result, the current I provided by module 100 is not substantially the same as $I_1$ and $I_2$. In this configuration module 100 now provides two different terminal voltages $V_1$ and $V_2$, the terminal voltages of sub-modules 101 and 102, respectively, according to a specific embodiment.

Depending on the embodiments, the present invention provides various methods for not matching the currents in sub-modules 101 and 102. In a specific embodiment, a cell in sub-module 101, e.g. cell 111, may have different characteristics from a cell in sub-module 102, e.g. cell 121. For example, cell 111 may have a different band gap in the absorber layer from cell 121.

As another example, cell 111 may have different optical absorption properties from cell 121. For instance, they may absorb light from different parts of the optical spectrum, or they may have different optical absorption coefficients or different carrier generation efficiencies. One or more of these parameters can be used to modify the current generated in each cell. Additionally, in a specific embodiment of the invention, the cell area is selected to provide a predetermined cell current or to not match currents from two different cells. Of course, there can be other variations, modifications, and alternatives.

For example, if cell 111 is formed using a first material to provide a current density of $i_1$ per unit area and has a cell area $A_1$, then the cell current for cell 111 is $I_1=A_1*i_1$. Similarly, if cell 121 is formed using a second material to provides a current density of $i_2$ per unit area and has a cell area $A_2$, then the cell current for cell 121 is $I_2=A_2*i_2$. Given $i_1$ and $i_2$, cell area $A_1$ for cell 111 and cell area $A_2$ for cell 121 can then be selected such that $A_1*i_1 \neq A_2*i_2$, which will substantially not match the currents, i.e. $I_1$ is not equal to $I_2$.

If the sub-modules have the same total area, then there can be different numbers of cells in each of the sub-modules. Accordingly, in a specific embodiment, the number of cells in each sub-module can be selected for no current matching. For example, if sub-module 101 has N cells and sub-module 102 has M cells, where N and M are integers, then N and M are selected to not match a first current through the plurality of first photovoltaic devices in sub-module 101 and a second current through the plurality of second photovoltaic devices in sub-module 102.

In a specific embodiment shown in FIG. 1, the areas of cells 111-118 and the areas of cells 121-126 are selected such that the currents $I_1$ and $I_2$ are not matched. In this embodiment, cells in a sub-module can be optimized for performance independent of the other sub-modules. Alternatively, various other parameters can be selected for no current matching purposes. For example, semiconductor materials having different band gaps and optical absorption properties can also be used to determine the cell current. Of course, one of ordinary skill in the art would recognize many variations, modifications, and alternatives.

In some embodiments, module 100 can be constructed to better utilize the optical spectrum of the light source. As an example, sub-module 101 is constructed to absorb the shorter wave length portion of the sunlight spectrum, and sub-module 102 is constructed to absorb the longer wavelength portion of the sunlight. In a specific example, sub-module 101 can be made from a wider band gap material than sub-module 102. By stacking sub-module 101 over sub-module 102, the sun light not absorbed by sub-module 101 will be absorbed by sub-module 102.

In some embodiments of the multi-terminal photovoltaic module, the cells in sub-module 101 have band gaps in the first band gap range, and the cells in sub-module 102 have band gaps in the second band gap range. In some embodiments, the first band gap range can extend from about 1.4 eV to about 2.5 eV. In a specific embodiment, the first band gap range can extend from about 1.6 eV to about 2.3 eV. In some embodiments, the second band gap range can extend from about 0.7 eV to about 1.2 eV. In an embodiment, the second band gap range can extend from about 0.4 eV to about 1.0 eV. Of course, there can be other variations, modifications, and alternatives.

In embodiments of the present invention, the voltage provided by each cell is related to an open circuit voltage of the cell. In some embodiments of the multi-terminal photovoltaic module, the cells in sub-module 101 have a first open circuit voltage, and the cells in sub-module 102 have a second open circuit voltage. In some embodiments, the first open circuit voltage ranges from about 0.7V to about 1.5V. In some embodiments, the first open circuit voltage ranges from about 0.6V to about 1.2V. In certain embodiments, the first open circuit voltage ranges from about 0.5V to about 1.1V. In some embodiments, the second open circuit voltage ranges from about 0.2V to about 0.8V. In other embodiments, the second open circuit voltage ranges from about 0.3V to about 0.7V. In alternative embodiments, the second open circuit voltage ranges from about 0.2V to about 0.6V. Of course, there can be other variations, modifications, and alternatives.

Optionally, a third sub-module can be added to convert the sunlight in a portion of the spectrum not used by sub-module 101 and sub-module 102. The third sub-module can be bonded to sub-module 102 in a similar way as described above. Similarly, multiple sub-modules can be bonded together using the techniques described above.

In an alternative embodiment, each cell in module 100 can be a multi junction cell. For example, each of cells 111-118 in sub-module 102 can include stacked multiple junctions which absorb different portions of the sunlight spectrum. The multi junction cells can have two external terminals or three external terminals.

Figure 2:
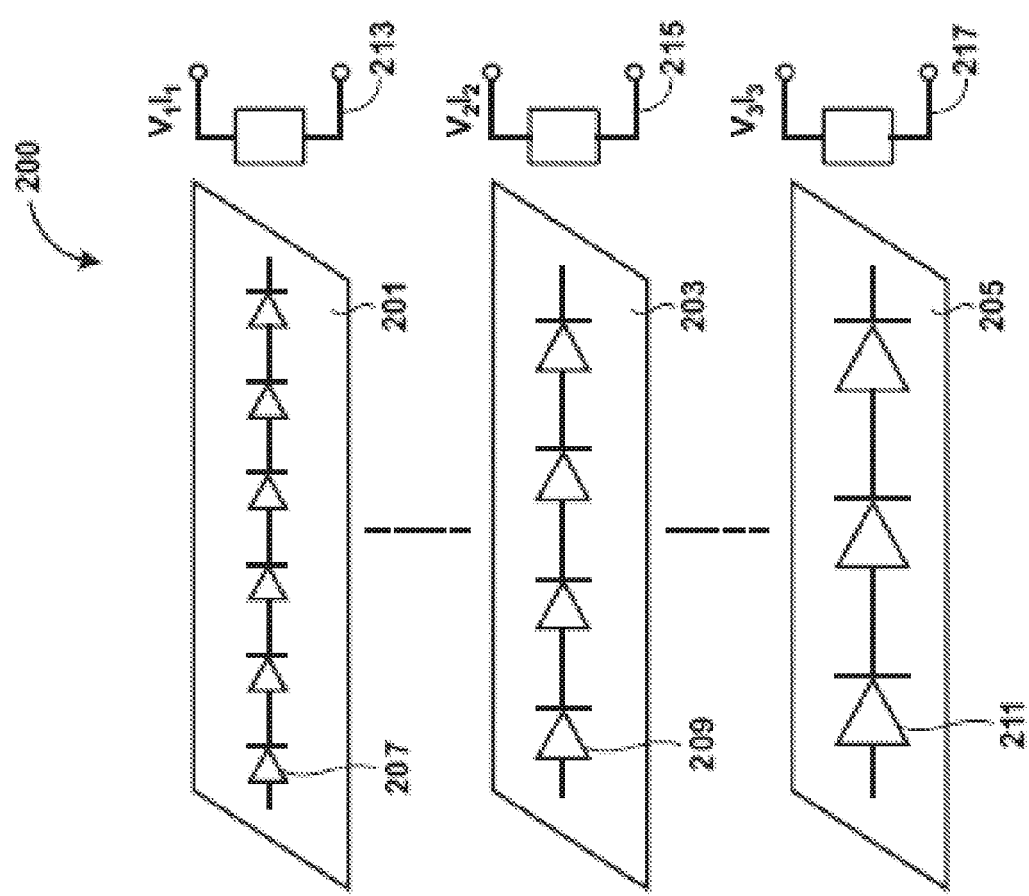
FIG. 2 is a simplified diagram of further details of a structure for a module having a multi-terminal cells according to a specific embodiment of the present invention.

FIG. 2 is a simplified diagram of further details of a structure for a module having a multi junction cell according to a specific embodiment of the present invention. This diagram is merely an example, which should not unduly limit the scope of the claims herein. One of ordinary skill in the art would recognize other variations, modifications, and alternatives. As shown, photovoltaic module 200 includes sub-modules 201, 203, and 205, etc. Each of the sub-modules includes multiple solar cells connected in series. For example, sub-module 201 includes multiple solar cells such as 207. Sub-module 201 is shown schematically as device 213, which is characterized by voltage $V_1$ and current $I_1$. Similarly, sub-module 203 includes multiple solar cells such as 209 connected serially. Sub-module 203 is shown schematically as device 215, which is characterized by voltage $V_2$ and current $I_2$. Additionally, sub-module 205 includes multiple solar cells such as 211 serially connected. Sub-module 202 is shown schematically as device 217, which is characterized by voltage $V_3$ and current $I_3$.

In a specific embodiment, sub-modules 201, 203, 205, etc., can be configured according to the method described above in connection with FIG. 1. For example, sub-modules 201, 203, and 205, etc., are stacked, and each can be constructed to absorb and convert light energies from a different portion of the sunlight spectrum. In the serial combination, the currents are not matched, such that $I_1$ is not equal to $I_2$, which is not equal to $I_3$. In a specific embodiment, the device areas are selected to not match the currents. Of course, there are many variations, modifications, and alternatives.

Figure 3:
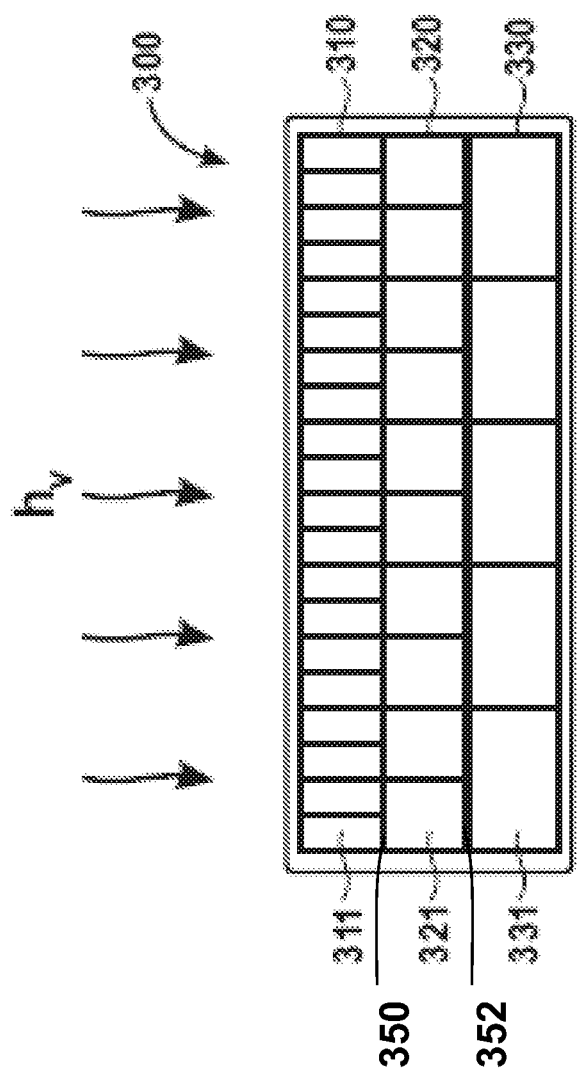
FIG. 3 is a simplified side-view diagram of a structure for multi-terminal cells according to a specific embodiment of the present invention.

FIG. 3 is a simplified side-view diagram of a structure for a multi-terminal module according to a specific embodiment of the present invention. This diagram is merely an example, which should not unduly limit the scope of the claims herein. One of ordinary skill in the art would recognize other variations, modifications, and alternatives. As shown, multi-terminal module 300 includes sub-modules such as 310, 320, and 330, etc. Each of the sub-modules includes a number of solar cells. For example, sub-module 310 includes cells such as 311, sub-module 320 includes cells such as 321, and sub-module 330 includes cells such as 331, etc. In an embodiment, the sub-modules are isolated by insulating materials 350 and 351, as shown in FIG. 3. Within each sub-module, the cells are connected serially, and the current in each cell are matched. The current for each sub-module, e.g. current $I_1$ for sub-module 310, current $I_2$ for sub-module 320, and current $I_3$ for sub-module 330, etc, are not matched. Let $V_1$, $V_2$, and $V_3$, etc., represent the terminal voltage of sub-modules 310, 320, and 330, etc., respectively.

Referring to FIG. 3, in an embodiment, $V_1$, $V_2$, and $V_3$, etc. are not necessarily the same voltages. Depending on the application, each of $V_1$, $V_2$, and $V_3$, etc. can represent a different voltage In a specific embodiment, at least one of the currents, $I_1$, $I_2$, and $I_3$ does not match another one of $I_1$, $I_2$, and $I_3$. In another specific embodiment, one of $I_1$, $I_2$, and $I_3$, is not match to every other current. Of course, there can be other modifications, variations, and alternatives.

Figure 4:
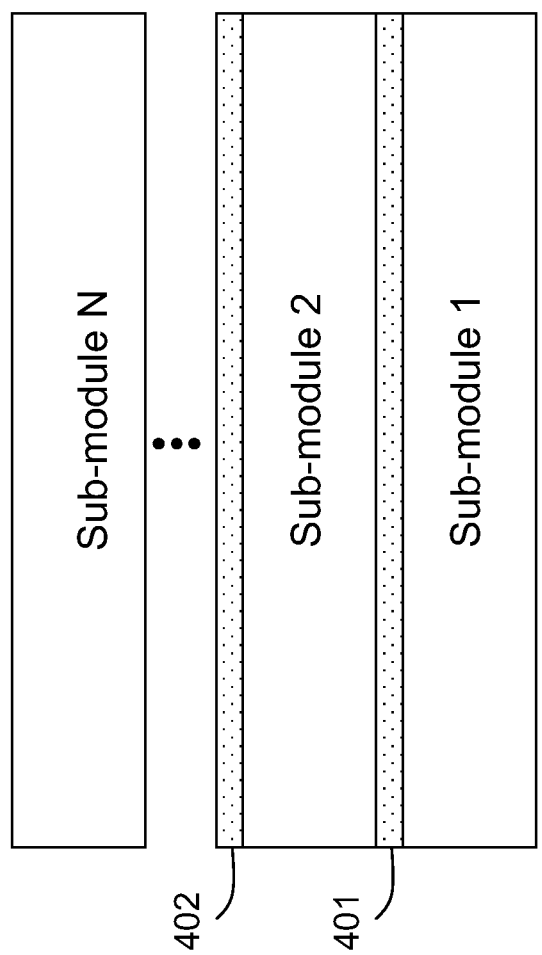
FIG. 4 is a simplified side-view diagram of a structure for multi-terminal cells according to another specific embodiment of the present invention.

FIG. 4 is a simplified side-view diagram of a structure for multi-terminal cells according to another specific embodiment of the present invention. This diagram is merely an example, which should not unduly limit the scope of the claims herein. One of ordinary skill in the art would recognize other variations, modifications, and alternatives. As shown, FIG. 4 includes a simplified description of a module including N sub-modules, sub-module 1, sub-module 2, . . . , sub-module N. An insulating material, e.g., 401, 402, . . . , etc., isolate adjacent sub-modules. In an embodiment, the insulating material can also include bonding materials for bonding adjacent sub-modules. Let the currents for modules 1, 2, 3, . . . , and N be $I_1$, $I_2$, $I_3$, . . . and $I_N$, respectively, and the corresponding voltages for modules 1, 2, 3, . . . , and N be $V_1$, $V_2$, $V_3$, . . . , and $V_N$, respectively. The current and voltage for each of the modules can be taken from the electrodes of each sub-module (not shown). In some embodiments of the present invention, the currents are not matched. In certain embodiments, the voltages are not matched. In a specific embodiment, at least one of the currents, $I_1$, $I_2$, $I_3$, . . . and $I_N$ does not match another one of $I_1$, $I_2$, $I_3$, . . . and $I_N$. In another specific embodiment, one of $I_1$, $I_2$, $I_3$, . . . and $I_N$, is not match to every other current. In an embodiment, at least one of the voltages, $V_1$, $V_2$, $V_3$, . . . and $V_N$ does not match another one of $V_1$, $V_2$, $V_3$, . . . and $V_N$. In another specific embodiment, one of $V_1$, $V_2$, $V_3$, . . . and $V_N$, is not match to every other voltage. Of course, there can be other modifications, variations, and alternatives.

Figure 5:
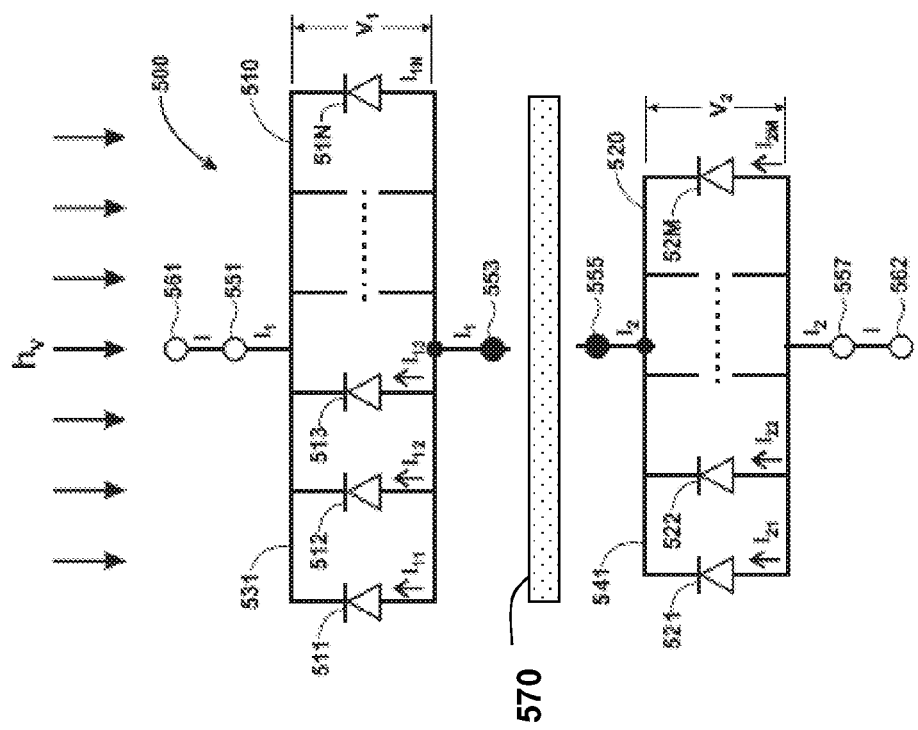
FIG. 5 is a simplified diagram of a structure for a module having multi-terminal cells according to another embodiment of the present invention.

FIG. 5 is a simplified diagram of a structure for a module 500 having a multi-terminal module according to another embodiment of the present invention. This diagram is merely an example, which should not unduly limit the scope of the claims herein. One of ordinary skill-in-the-art would recognize other variations, modifications, and alternatives. As shown, solar module 500 is formed on a substrate (not shown) and includes sub-module 510 and sub-module 520. In the specific embodiment shown in FIG. 5, sub-module 510 includes N photovoltaic devices labeled as cells 511, 512, . . . , 51N, where N is an integer. Each of the N photovoltaic devices is shown schematically as a diode. Sub-module 510 also has a first connector 531 interconnecting photovoltaic devices 511-51N in a parallel configuration. The first connector 531 has a first terminal end 551 and a second terminal end 553. As shown in FIG. 5, sub-module 520 includes M photovoltaic devices labeled as cells 521-52M, where M is an integer. Again, each of the photovoltaic devices is shown schematically as a diode. Sub-module 520 also has a second connector 541 interconnecting solar cells 521-52M in a parallel configuration. The second connector 541 has a first terminal end 555 and a second terminal end 557.

In the specific embodiment shown in FIG. 5, module 500 has a third connector 559 connecting terminal end 553 of sub-module 510 to terminal end 555 of sub-module 520. Module 100 also includes a first output node 561 connected to terminal end 551 of sub-module 510 and a second output node 562 connected to terminal end 557 of sub-module 520. As shown, sub-modules 510 and 520 are not serially connected in module 500.

In a specific embodiment, cells 511-51N in sub-module 510 are made of a semiconductor material having a first band gap and a first device area. Cells 511-51N provide currents $I_{11}$-$I_{1N}$, respectively. The sum of currents I11-I1N is designated as $I_1$. As shown, cells 511-51N are connected in parallel between terminal ends 551 and 553 of sub-module 510. A terminal voltage $V_1$ is provided between terminal ends 551 and 553.

Similarly, cells 521-52M in sub-module 520 are made of a second semiconductor material having a second band gap and a second device area. Cells 521-52M provide currents $I_{21}$-$I_{2M}$, respectively. The sum of currents $I_{21}$-$I_{2M}$ is designated as $I_2$. As shown, cells 521-52M are connected in parallel between terminal ends 555 and 557 of sub-module 520. A terminal voltage $V_2$ is provided between terminal ends 555 and 557.

According to an embodiment of the invention, sub-module 510 and sub-module 520 are nor connected to form module 500, as shown in FIG. 5. A first output node 561 of module 500 is coupled to the first terminal end 551 of the first connector 531, and a second output node 562 is coupled to the second terminal end 557 of the second connector 541. Additionally, bonding material 570 in module 500 is disposed between sub-modules 510 and 520 to electrically insulate sub-modules 510 and 520 and bond the sub-modules together mechanically. In this embodiment, the total current $I_1$ in sub-module 510 and the total current $I_2$ in sub-module 520 are substantially not matched. As a result, the current provided by module 500 is substantially not the same as $I_1$ or $I_2$. In this configuration module 500 now provides two terminal voltages $V_1$ and $V_2$, the terminal voltages of sub-modules 510 and 520, respectively.

Each cell in sub-modules 510 and 520 may have different characteristics which may result in different cell currents. For example, these characteristics may include energy band gap of the absorber layer material, optical absorption properties in different portions of the optical spectrum, and carrier generation efficiencies, etc. One or more of these parameters can be used to modify the current generated in each cell. Additionally, in a specific embodiment of the invention, the cell area is selected to provide a predetermined cell current or to not match currents from two different cells.

According to a specific embodiment, the present invention provides a method for a parallel and serial combination of photovoltaic devices. In this embodiment, cells in a sub-module can be optimized for performance independent of the other sub-modules. As illustrated in FIG. 5, the current not matching condition of module 500 and the terminal voltages can be expressed in the following equations.

$$I_{11}+I_{12}+I_{13}+\ldots+I_{1N} \neq I_{21}+I_{22}+\ldots+I_{2M} \quad (1)$$

Separate terminal voltages $V_1$ and $V_2$                     (2)

As a specific example, if each of cells 511-51N is formed using a first material to provide a current of $i_1$, then the total cell current for sub-module 510 is $I_1 = N*i_1$. Similarly, if each of cells in sub-module 520 is formed using a second material to provides a current of $i_2$, then the total cell current for sub-module 520 is $I_2 = M*i_2$. Sub-modules 510 and 520 can be advantageously not connected in series if N and M are selected such that $N*i_1 = M*i_2$, which will substantially not match the currents, i.e. $I_1 \neq I_2$. Each of the sub-modules is operated independently from each other according to a specific embodiment.

In an embodiment, sub-module 510 is constructed to absorb the shorter wave length portion of the sunlight spectrum, and sub-module 520 is constructed to absorb the longer wavelength portion of the sunlight. In a specific example, sub-module 510 can be made from a wider band gap material than sub-module 520. By stacking sub-module 510 over sub-module 520, the sun light not absorbed by sub-module 510 can be absorbed and converted to electric current by sub-module 520. Optionally, a third sub-module can be added to convert the sunlight in a portion of the spectrum not used by sub-module 510 and sub-module 520. The third sub-module can be connected to sub-module 520 in a similar way as described above.

In an alternative embodiment, each cell in module 500 can be a multi junction cell. For example, each of cells 511-51N in sub-module 510 can include stacked multiple junctions which absorb different portions of the sunlight spectrum. The multi junction cells can have two external terminals or three external terminals.

In the above discussion, each photovoltaic device in FIGS. 1, 2, and 5 is shown schematically as a diode, such as devices 111 and 121 in FIG. 1, devices 207, 209, and 211 in FIG. 2, and devices 511 and 521 in FIG. 5. Examples of photovoltaic devices can be found in U.S. patent application Ser. No. 11/748,444, filed May 14, 2007, U.S. patent application Ser. No. 11/804,019, filed May 15, 2007, and U.S. Provisional Patent Application No. 60/988,099, filed Nov. 14, 2007. All these applications are commonly assigned, and their contents are hereby incorporated by reference for all purposes.

Additionally, it is also noted that each of the photovoltaic devices in embodiments of this application can be a parallel or serial combination of photovoltaic devices, or even a parallel and serial combination of photovoltaic devices. Some of these interconnect combinations are discussed throughout this application. Various modifications or changes in light thereof will be suggested to persons skilled in the art and are to be included within the spirit and purview of this application.

According to a specific embodiment of the present invention, a method for making a multi junction solar module device can be briefly outlined below.

1. Form a first sub-module, the first sub-module includes a plurality of first photovoltaic devices, each of the plurality of first photovoltaic devices being characterized by a first device area and having a first band gap characteristic for providing a predetermined electrical current;

2. Interconnect the plurality of first photovoltaic devices in a serial configuration; (This process may be integrated in the above)

3. Form a second sub-module, the second sub-module includes a plurality of second photovoltaic devices, each of the plurality of second photovoltaic devices being characterized by a second device area and having a second band gap characteristic for providing the predetermined electrical current;

4. Interconnect the plurality of second photovoltaic devices in a serial configuration; (This process may be integrated in the above)

5. Mount the first sub-module over the second sub-module.

Figure 6:
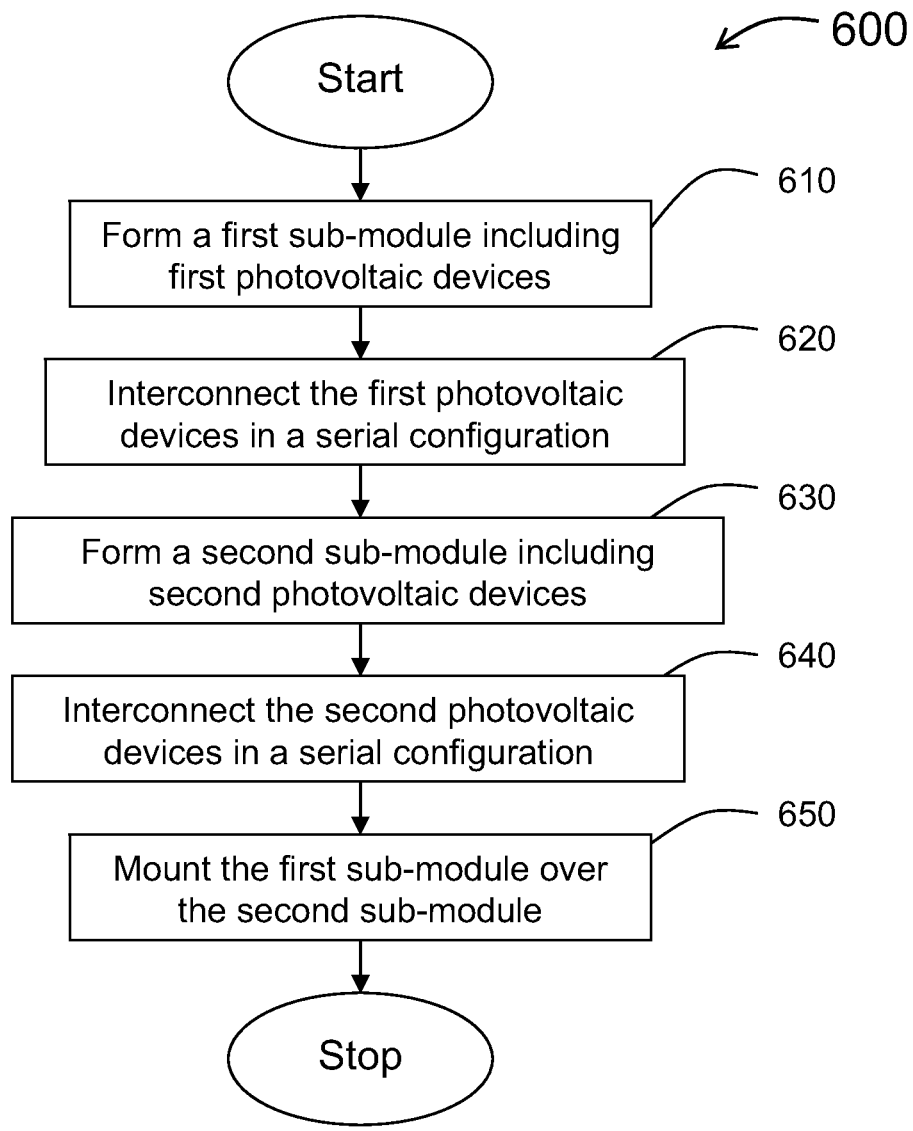
FIG. 6 is a simplified diagram of a method forming a solar module having multi-terminal cells according to an embodiment of the present invention.

FIG. 6 is a simplified diagram of a method forming a solar module having multi-terminal cells according to an embodiment of the present invention. This diagram is merely an example, which should not unduly limit the scope of the claims herein. One of ordinary skill in the art would recognize other variations, modifications, and alternatives. One of ordinary skill in the art would recognize other variations, modifications, and alternatives.

Figure 7:
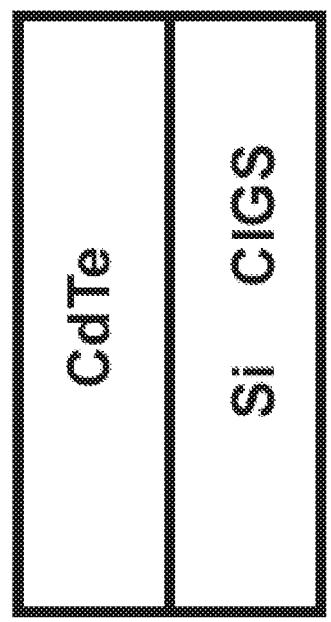
FIG. 7 is an example of photovoltaic device can be arranged as first, second, third, and Nth devices in a sub-module according to a specific embodiment of the present invention.

FIG. 7 is an example of photovoltaic device can be arranged as first, second, third, and Nth devices in a sub-module according to a specific embodiment of the present invention. As shown, an upper cell can be made of cadmium telluride (CdTe) material that is a crystalline compound formed from cadmium and tellurium. In a specific embodiment, the CdTe has a zinc blend (cubic) crystal structure. As an example, the CdTe crystalline form is a direct band gap semiconductor. Depending upon the embodiment, the CdTe is sandwiched with cadmium sulfide to form a pn junction photovoltaic solar cell. Of course, there can be other variations, alternatives, and modifications. Additionally, the lower cell can be made of an alternative material that receives any traversing energy through the upper cell. As an example, the lower cell can be made of a suitable material such as silicon, polysilicon, CIGS, and other materials.

In a preferred embodiment, the upper cell can be made according to High Efficiency Photovoltaic Cell and Manufacturing Method listed under U.S. Ser. No. 61/059,253, commonly assigned, and hereby incorporated for all purposes. In one or more embodiments, the top cell comprises an absorber layer selected from $CuInS_2$, SnS, $Cu(In_2Al)S_2$, $Cu(In_{1-x})$, $Al_x)S_2$, $Cu(In, Ga)S_2$, or $Cu (In_{1-x}, Ga)S_2$ or other suitable materials. In other specific embodiments, the bottom cell may comprise an absorber layer selected from CIGS, $Cu_2SnS_3$, $FeS_2$, or Ge or others.

As noted, according to a specific embodiment, the present invention includes a method and system that includes a 4-terminal module, which is a preferred embodiment. In a specific embodiment, the method and system is the extension of the 4-terminal device into a system design and deployable format for use of 4-terminal modules in the field. The present 4-terminal module would include at least two individual functioning electrical devices that are physically bonded to each other but have no electrical contact. The modules are placed into photovoltaic arrays in a manner similar to flat-plate module deployment already used across the PV industry. However, these modules have four terminals and include at least two devices, the top device, and the bottom device in arrangement to the sun. In a preferred embodiment the top device is made of a higher band gap thin-film material, although it would be recognized that there may be other configurations. In this same preferred embodiment, the bottom device is made of a lower band gap thin-film material, although it would be recognized that there may be other configurations. This arrangement allows the top device to electrically convert high energy photons, while lower energy photons pass through to the bottom device and are converted electrically by that device. The terminals of the top devices across a multi-module system are connected to each other according to standard electrical design parameters commonly used in the PV industry. The terminals of the bottom devices across a multi-module system are also connected to each other according to standard electrical design parameters commonly used in the PV industry. Top devices and bottom devices are never electrically connected in photovoltaic systems using this preferred embodiment. They are, however, physically bonded into one manufactured module/product. In aggregate, the connected top devices across a multi-module system form one electrically functioning system which is connected into an appropriate inverter with operating characteristics and power output ratings tailored to the function of this top system. In aggregate and electrically separate to the connected top devices, the bottom devices across a multi-module system also form one electrically function system. This system is likewise connected into an appropriate but different inverter with operating characteristics and power output ratings tailored to the function of this bottom system.

Key advantages: In current PV devices whether bifacial or via multi-junction/layer cells, devices have to be integrated electrically in order to form a 2 terminal device with connectors fit for deployment in the field. This integration step leads to operational inefficiency, and developmental disadvantages. Particularly, integrated cells must be electrically tailored to each other which often entails sacrificing efficiency. Cells are also positioned relative to the sun in order to take advantage of varying photonic wavelengths and to capture more of the solar spectrum. However, in the field this also means that devices of varying position (e.g. top, bottom, middle) relative to the sun prefer different types of sunlight that correspond to different times of the day (e.g. noon, dawn, dusk, etc.). This further complicates electrical integration and leads to operational inefficiencies when the modules are deployed in the field.

Figure 8:
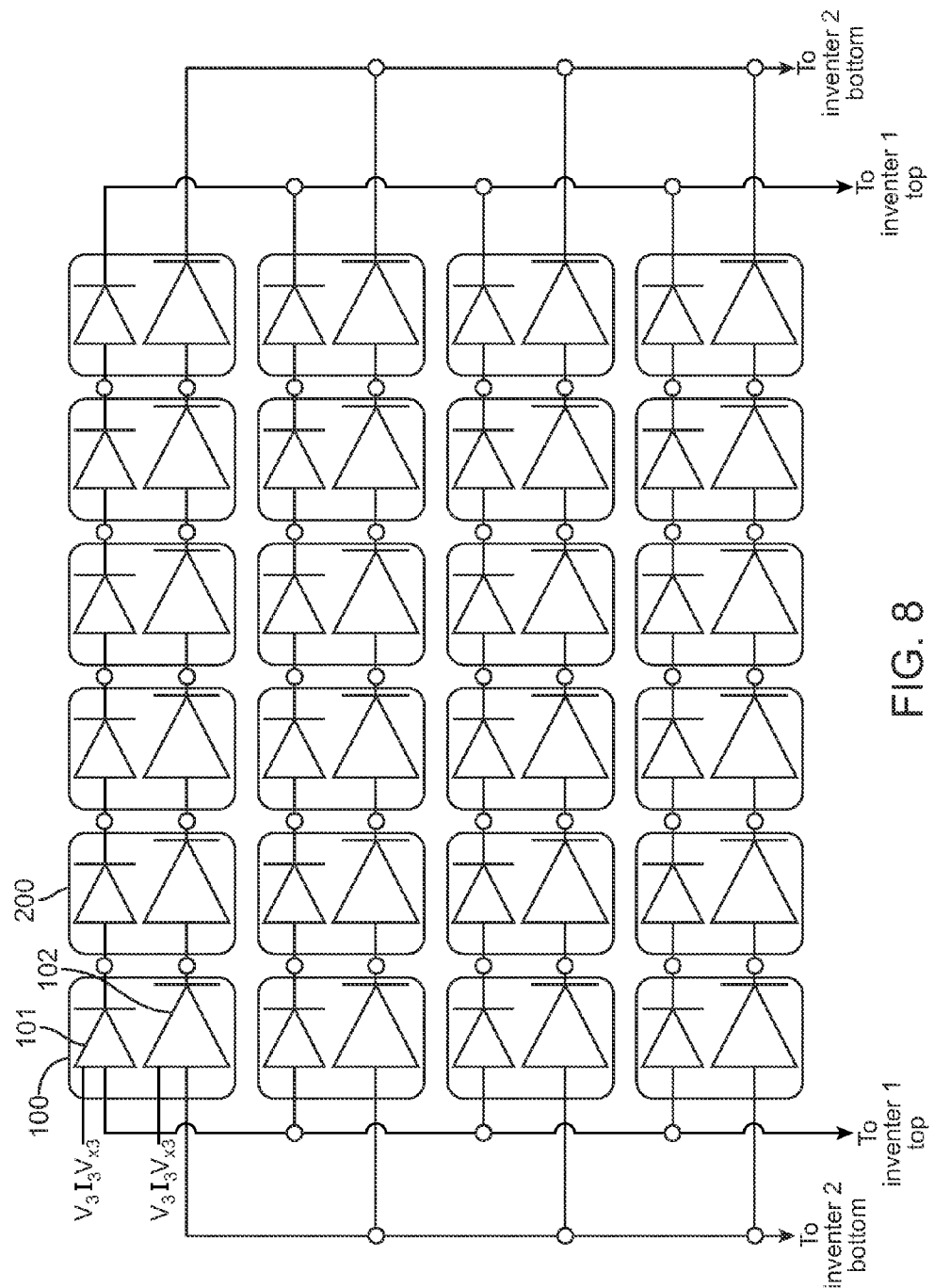
FIG. 8 is a simplified diagram illustrating a multi-terminal photovoltaic module according to another embodiment of the present invention.

As shown in FIG. 8, photovoltaic module 100 is formed on a substrate (not shown) and includes sub-module 101 and sub-module 102. Photovoltaic module 200 and all subsequent modules in the figure are identical modules to module 100.

Figure 9:
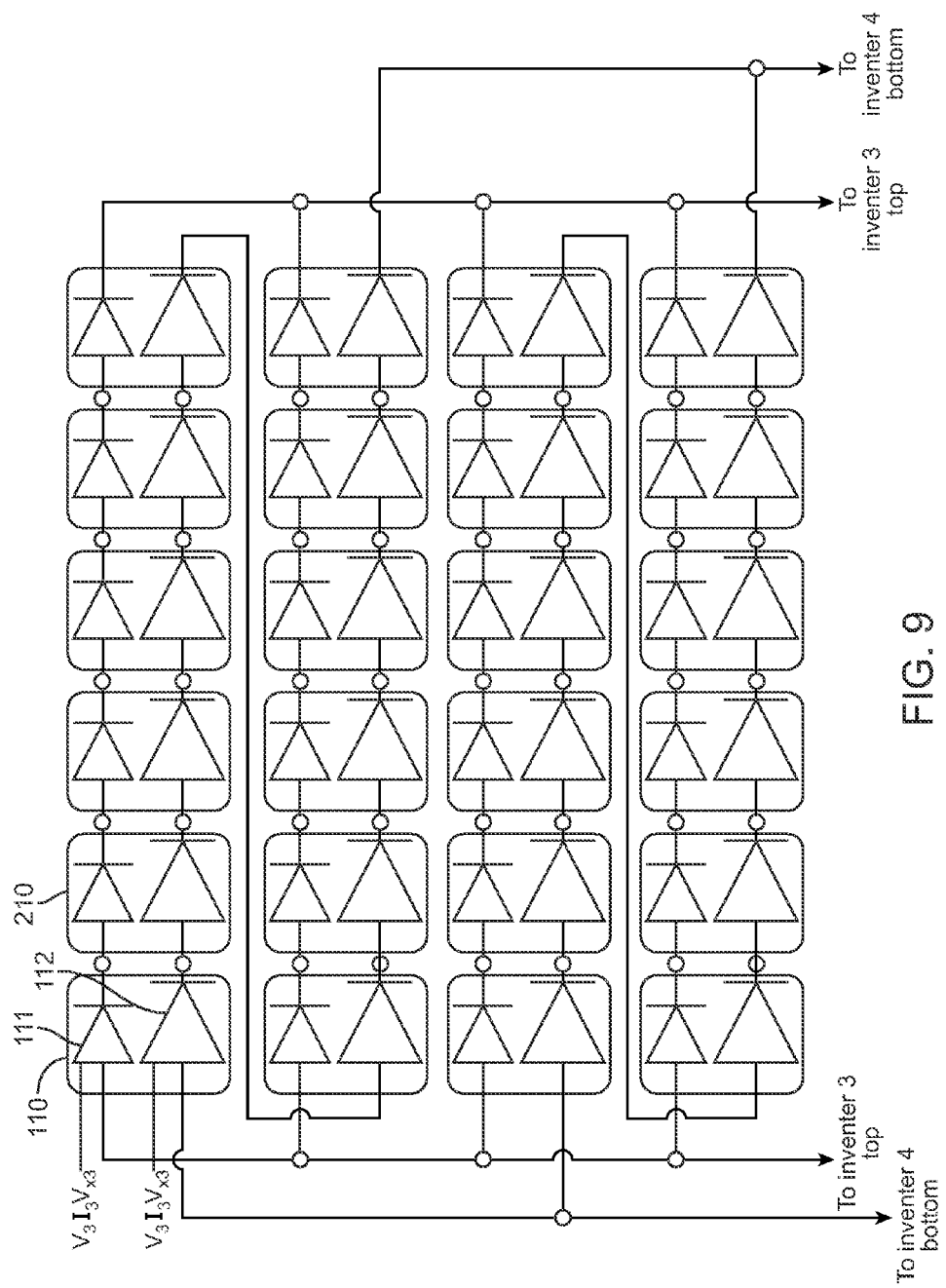
FIG. 9 is a simplified diagram illustrating a multi-terminal photovoltaic module according to an alternative embodiment of the present invention.

As shown in FIG. 9, photovoltaic module 110 is formed on a substrate (not shown) and includes sub-module 111 and sub-module 112. Photovoltaic module 210 and all subsequent modules in the figure are identical modules to module 110.

Figure 10:
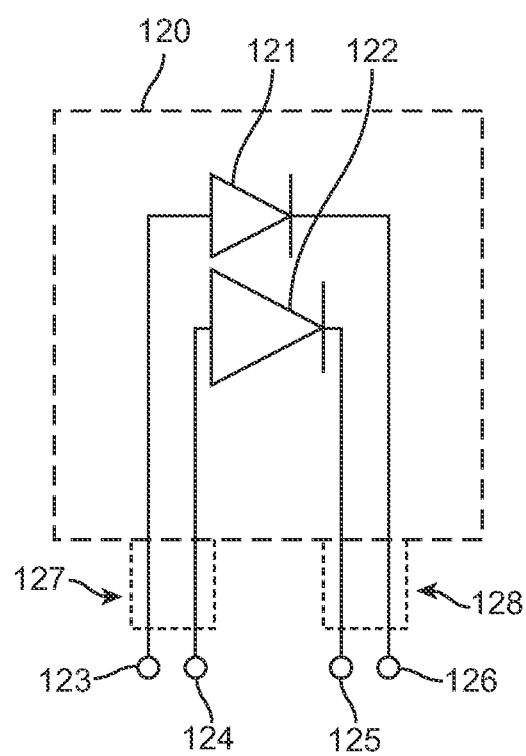
FIG. 10 a simplified diagram illustrating a multi-terminal photovoltaic module according to another alternative embodiment of the present invention.

In one specific embodiment (shown in FIG. 10) the positive terminals of the top and bottom devices and the negative terminals of the top and bottom devices can be combined into one individual terminal physically, but not electrically. Physical terminal 127 includes two electrical terminals 123 and 124, both of which are negative. It should be recognized that there may be other embodiments. Physical terminal 128 includes two electrical terminals 125 and 126, both of which are positive. It should be recognized that there may be other embodiments. Electrical terminal 123 is the negative terminal for the top device. Electrical terminal 124 is the negative terminal for the bottom device. Electrical terminal 125 is the positive terminal for the top device. Electrical terminal 126 is the positive terminal for the bottom device. In this way, each physical terminal includes electrically functioning but separate elements which feed into separate systems. Because the physical terminals unite two positives or two negatives physically, the deployment of the modules in the field becomes easier because dual positive terminals can be connected to dual negative terminals in order to form a series connection and this reduces the number of connections required of installers than if the module were a true 4 terminal design with 4 physically separate terminals.

This new method creates two separately operating systems and enables higher electricity production because it avoids the numerous efficiency and performance disadvantages associated with electrical integration at the module level.

In one preferred embodiment, the number of devices in series is the same for both the top and the bottom systems. The maximum number of devices in series is determined by dividing the allowed NEC voltage of 600V (or 1000V in certain applications) by the maximum operating voltage of the device. $Voc_1$ and $Voc_2$ are the maximum open circuit voltages of the devices in FIG. 8. $Voc_3$ and $Voc_4$ are the maximum open circuit voltages of the devices in FIG. 9. In FIG. 8, the number of devices in series is the same for the top and bottom systems and is 6 in this case, although the exact number will depend on the previously described calculation.

In another preferred embodiment the number of devices in series is different for the top and bottom systems. In FIG. 9, the number of devices in series is 6 for the top system and 12 for the bottom system. These specific numbers are merely by way of example and exact numbers will depend on the previously described calculation based on NEC voltage requirements. If the number of devices in series for the top and bottom system is the same as in FIG. 8, this is the preferred embodiment to employ the innovation in FIG. 10, referring to physically bonded but electrically separate terminals. However, it should be recognized that embodiments more similar to FIG. 9, in which the number of devices in series is different between the top and bottom systems, and others could also use the innovation shown in FIG. 10.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A multi-terminal photovoltaic module comprising:
   an upper photovoltaic device comprising a first upper electrode, an overlying upper absorber layer, an overlying upper window layer, and a second upper electrode, the upper absorber layer having an upper band gap in a first band gap range;
   a lower photovoltaic device comprising a first lower electrode, an overlying lower absorber layer, an overlying lower window layer, and a second lower electrode, the lower absorber layer having a lower band gap in a second band gap range;
   a bonding material coupling the second upper electrode and the first lower electrode;
   a first upper terminal coupling the first upper electrode and a second upper terminal coupling the second upper electrode;
   a first lower terminal coupling the first lower electrode and a second lower terminal coupling the second lower electrode, wherein the first upper terminal and first lower terminal represent positive terminals and are physically combined into a single positive terminal while being maintained electrically isolated from one another within the single positive terminal, and wherein the second upper terminal and second lower terminal represent the negative terminals and are physically combined into a single negative terminal while being maintained electrically isolated from one another within the single negative terminal;

a first open circuit voltage provided between the first upper electrode and the second upper electrode; and a second open circuit voltage provided between the first lower electrode and the second lower electrode;

wherein the first open circuit voltage is different from the second open circuit voltage; and wherein the upper photovoltaic device has a first area and an associated first current, and wherein the first current is a function of the first area, material of the upper absorber layer, and current density of the upper photovoltaic device;

wherein the lower photovoltaic device has a second area and an associated second current, and wherein the second current is a function of the second area, material of the lower absorber layer, and current density of the lower photovoltaic device; and wherein the first current is not matched to the second current.

2. The module of claim 1 further comprising a first inverter coupling the first upper terminal and the second upper terminal.

3. The module of claim 1 further comprising a second inverter coupling the first lower terminal and the second lower terminal.

4. The module of claim 1 wherein the first band gap range extends from 1.4 eV to 2.5 eV.

5. The module of claim 1 wherein the first band gap range extends from 1.6 eV to 2.3 eV.

6. The module of claim 1 wherein the second band gap range extends from 0.7 eV to 1.2 eV.

7. The module of claim 1 wherein the second band gap range extends from 0.4 eV to 1.0 eV.

8. The module of claim 1 wherein the first open circuit voltage ranges from 0.7V to 1.5V.

9. The module of claim 1 wherein the first open circuit voltage ranges from 0.6V to 1.2V.

10. The module of claim 1 wherein the first open circuit voltage ranges from 0.5V to 1.1V.

11. The module of claim 1 wherein the second open circuit voltage ranges from 0.2V to 0.8V.

12. The module of claim 1 wherein the second open circuit voltage ranges from 0.3V to 0.7V.

13. The module of claim 1 wherein the second open circuit voltage ranges from 0.2V to 0.6V.

14. The module of claim 1 wherein the bonding material comprises EVA.

15. The module of claim 1 wherein the bonding material comprises a double sided tape material.

\* \* \* \* \*